United States Patent
Oyu et al.

(10) Patent No.: US 7,632,696 B2
(45) Date of Patent: Dec. 15, 2009

(54) SEMICONDUCTOR CHIP WITH A POROUS SINGLE CRYSTAL LAYER AND MANUFACTURING METHOD OF THE SAME

(75) Inventors: Kiyonori Oyu, Tokyo (JP); Koji Hamada, Tokyo (JP); Kensuke Okonogi, Tokyo (JP); Hideharu Miyake, Tokyo (JP); Yasushi Kozuki, Tokyo (JP); Masaharu Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 351 days.

(21) Appl. No.: 11/372,351

(22) Filed: Mar. 10, 2006

(65) Prior Publication Data

US 2006/0249075 A1 Nov. 9, 2006

(30) Foreign Application Priority Data

Mar. 11, 2005 (JP) ............................. 2005-070152
Dec. 14, 2005 (JP) ............................. 2005-361123

(51) Int. Cl.
*H01L 21/00* (2006.01)
(52) U.S. Cl. .................. 438/33; 438/409; 438/460; 438/693; 438/704; 438/751
(58) Field of Classification Search .................. 438/33, 438/409, 460, 693, 704, 751
See application file for complete search history.

(56) References Cited

U.S. PATENT DOCUMENTS 6,248,664 B1 6/2001 Saha et al.
6,453,440 B1 9/2002 Cypher
2003/0203598 A1* 10/2003 Yamada et al. .............. 438/478
2004/0262732 A1* 12/2004 Noma et al. ................. 257/685

FOREIGN PATENT DOCUMENTS

| JP | 60-148128 | 8/1985 |
|---|---|---|
| JP | 10-335632 | 12/1998 |
| JP | 11-204494 | 7/1999 |
| JP | 11-291168 | 10/1999 |
| JP | 2004-214598 | 7/2004 |

OTHER PUBLICATIONS

Ghandhi, "VLSI Fabrication Principles", John Wiley & Sons, 1983, pp. 517+.*
Chinese Office Action (with English translation) issued in Chinese Patent Application No. CN 2006100547362, dated Mar. 7, 2008.

* cited by examiner

*Primary Examiner*—Thanh V Pham
(74) *Attorney, Agent, or Firm*—McDermott Will & Emery LLP

(57) ABSTRACT

A semiconductor chip including a semiconductor substrate provided with a semiconductor device region and a porous single crystal layer, where the semiconductor device region is formed on the main surface portion of the semiconductor substrate, and the porous single crystal layer is formed in an inner region on the backside of the semiconductor substrate, and is comprised of erosion holes extending continuously from the backside of the semiconductor substrate in an inward direction of the semiconductor substrate, oxide films formed on inner surfaces of the erosion holes, and a single crystal portion.

13 Claims, 13 Drawing Sheets

THICKNESS OF POROUS SINGLE CRYSTAL LAYER ($\mu$m)

THICKNESS OF POROUS SINGLE CRYSTAL LAYER ($\mu$m)

FIG. 26

| BINDING | BINDING ENERGY(eV) | PEAK INTENSITY | |
|---|---|---|---|
| | | FIG. 22 | FIG.25 |
| Si-Si | ~100 | 1~2 | 20~30 |
| Si-O | ~105 | ~30 | 10~20 |
| C-C | ~285 | ~90 | ~10 |
| Si-N | ~400 | ~10 | ~5 |
| Si-O | ~535 | ~200 | 100~150 |
| Si-F | ~690 | ~5 | ~1 |

SEMICONDUCTOR CHIP WITH A POROUS SINGLE CRYSTAL LAYER AND MANUFACTURING METHOD OF THE SAME

BACKGROUND OF THE INVENTION

1. Field of the Invention

The present invention relates to a semiconductor chip with a porous single crystal layer and manufacturing method of such a chip.

2. Related Art

In the process of manufacturing, processing or the like of a semiconductor wafer, a porous single crystal layer may occur in the semiconductor wafer. The porous single crystal layer becomes hindrance to junction in installing a plug in a semiconductor chip obtained from the semiconductor wafer, or the like, and therefore, is removed in the process of manufacturing, processing or the like of the semiconductor wafer. Hence, the semiconductor chip is typically not provided with the porous single crystal layer (JP H10-335632).

However, the semiconductor chip provided with the porous single crystal layer has been proposed in the case of semiconductor chips such as a photodiode dedicated to very limited applications. The porous single crystal layer has the property of converting a light beam with short wavelengths into a visible light beam. To use the property, it is an indispensable requirement to provide the porous single crystal layer to come into contact with an impurity region prepared on a main surface portion of the semiconductor chip (JP 2004-214598).

BRIEF SUMMARY OF THE INVENTION

Meanwhile, with progress in further miniaturization and weight reduction of electrical and electronic products, semiconductor devices in recent years have been required to obtain further miniaturization and weight reduction. Therefore, it has been demanded to further decrease a thickness of a semiconductor chip mounted on the semiconductor device.

However, when the thickness of the semiconductor chip is decreased, the semiconductor chip causes a failure easier in assembly of the semiconductor device or in the assembled device, and further, there is a tendency that the semiconductor device causes a malfunction more frequently after the assembly of the semiconductor device.

It is an object of the present invention to provide a semiconductor chip with less failure and high reliability and manufacturing method of such a semiconductor chip.

As a result of keen examinations to solve the above-mentioned problem, the inventors of the invention found that such a semiconductor chip serves the object of the invention that has a porous single crystal layer in an inner region on the backside opposed to the main surface portion on which semiconductor device regions are formed, and have reached completion of the invention.

In other words, the invention provides:

[1] a semiconductor chip including a semiconductor substrate provided with a semiconductor device region and a porous single crystal layer, where the semiconductor device region is formed on the main surface portion of the semiconductor substrate, and the porous single crystal layer is formed in an inner region on the backside of the semiconductor substrate, and is comprised of erosion holes extending continuously from the backside of the semiconductor substrate in an inward direction of the semiconductor substrate, oxide films formed on inner surfaces of the erosion holes, and a single crystal portion.

The invention further provides:

[2] the semiconductor chip as described in aforementioned item [1], where the porous single crystal layer has a thickness ranging from 0.02 μm to 5 μm as values from the backside of the semiconductor substrate with reference to the direction normal to the surface of the semiconductor substrate, and an amount of the single crystal portion ranges from 25 to 95 percent by volume relative to the total volume of the erosion holes, oxide films and single crystal layer portion in the porous single crystal layer.

The invention further provides:

[3] the semiconductor chip as described in above-mentioned item [1] or [2], where the single crystal portion is comprised of silicon containing boron, and a concentration of the boron is $1 \times 10^{18}/cm^3$ or more relative to the silicon.

The invention further provides:

[4] a method of manufacturing a semiconductor chip where the method includes steps (1) to (4) as described below, and the process of step (3) includes a stain etching method:

(1) a step of forming semiconductor device regions at respective positions on the main surface of a semiconductor wafer;

(2) a step of grinding the backside of the semiconductor wafer to a predetermined thickness;

(3) a step of providing a porous single crystal layer on the backside of the semiconductor wafer; and (4) a step of dicing the processed semiconductor wafer obtained from above-mentioned steps (1) to (3).

The invention further provides:

[5] the method of manufacturing a semiconductor chip as described in aforementioned item [4] where a polishing process and/or wet etching process is performed on the backside of the semiconductor wafer before above-mentioned step (3) after above-mentioned step (2) is finished.

The invention further provides:

[6] a semiconductor chip obtained from the manufacturing method as described in above-mentioned item [4] or [5].

The invention furthermore provides:

[7] a semiconductor device including the semiconductor chip as described in any one of above-mentioned items [1], [2], [3] and [6].

According to the invention, it is possible to provide a semiconductor chip with less failure and high reliability and a method of manufacturing such a chip.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 26 is a table summarizing results of analysis in FIGS. 22 and 25.

DETAILED DESCRIPTION OF THE INVENTION

Preferred embodiments to implement the invention will specifically be described in detail below with reference to accompanying drawings and photographs.

Semiconductor chips of the present invention will be described first.

Figure 1:
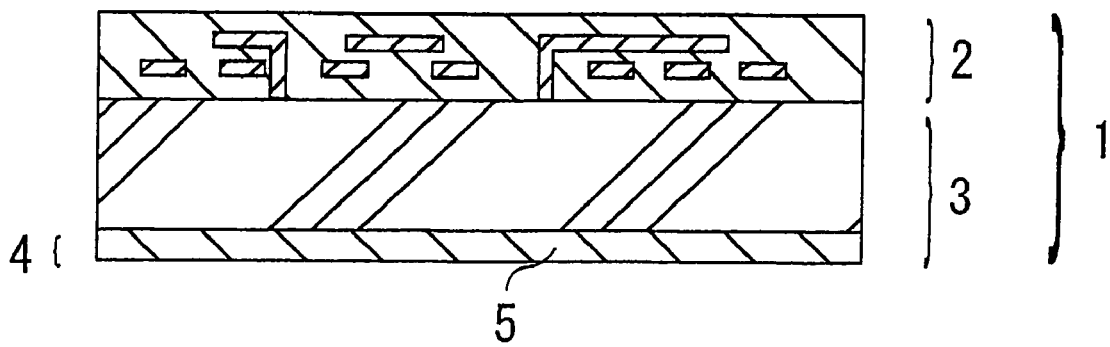
FIG. 1 is a schematic principal-part sectional view illustrating a semiconductor chip of the invention.

FIG. 1 illustrates one embodiment of the semiconductor chip of the invention.

As illustrated in FIG. 1, the semiconductor chip of the invention includes a semiconductor substrate 1 typically obtained by dicing a processed semiconductor wafer.

Semiconductor wafers as raw materials of the processed semiconductor wafer are not limited particularly, and specifically, any one generally used as a semiconductor wafer may be used in the invention such as, for example, a silicon wafer, gallium arsenide wafer, gallium nitride wafer and the like.

Preferably, the semiconductor wafer for use in the invention is a silicon wafer in terms of handling and the like.

It is necessary for the semiconductor chip of the invention that semiconductor device region 2 is formed on the main surface portion.

The semiconductor device region 2 is not limited particularly, as long as the region 2 causes the semiconductor chip to function as a semiconductor device. For example, the region 2 includes an impurity element and the like such as trivalent elements such as boron, gallium, indium and the like and pentavalent elements such as phosphorous, arsenic, antimony and the like in the main surface portion of the semiconductor substrate 1 forming the semiconductor chip, and as well as the impurity element and the like, further includes one type or two types or more of structures such as epitaxial layer, insulation film, electrode, interlayer insulation film, plug structure, barrier layer, metal wiring layer, antireflection film, and passivation layer as appropriate corresponding to characteristics of a desired semiconductor chip.

By combining the operation of introducing the impurity element to the semiconductor substrate 1 and the like as appropriate, for example, it is possible to form on the main surface portion of the semiconductor chip a bipolar structure, single-channel MOS structure such as n-channel, p-channel and the like, and CMOS structure such as p-well, n-well, twin well and like. By combining one type or two types or more of the structures as appropriate, it is possible to cause the semiconductor chip to function as a semiconductor device such as a memory device, logic device and the like, for example.

In addition, the main surface portion means a region including the semiconductor device region 2 in FIG. 1, and generally, means a region from the surface of the semiconductor substrate 1 up to 50% of the thickness of the semiconductor substrate 1 with reference to the direction normal to the surface of the semiconductor substrate 1. The region is preferably a region from the surface to 20% of the thickness, and more preferably, a region from the surface to 10% of the thickness.

As the semiconductor substrate 1 for use in the invention, such a substrate can be used that the impurity element exists in a region 3, as well as the semiconductor device region 2, as illustrated in FIG. 1.

Specific examples of the region 3 include a $p^+$-type region, $p^-$-type region, $n^+$-type region, $n^-$-region and the like, for example.

Among impurity elements contained in the $p^+$-type region and/or $p^-$-region are trivalent elements such as boron, gallium, indium and the like, for example.

Further, among impurity elements contained in the $n^+$-type region and/or $n^-$-type region are pentavalent elements such as phosphorus, arsenic, antimony and the like, for example.

The concentration of the impurity element in the $p^+$-type region generally ranges from $1 \times 10^7 /cm^3$ to $5 \times 10^{20}/cm^3$, and the concentration of the impurity element in the $p^-$-type region is generally less than $1 \times 10^{17}/cm^3$.

The concentration of the impurity element in the $n^+$-type region generally ranges from $1 \times 10^7 /cm^3$ to $5 \times 10^{20}/cm^3$, and the concentration of the impurity element in the $n^-$-type region is generally less than $1 \times 10^{17}/cm^3$.

It is preferable that the concentrations of the impurity element in the $p^-$-type region and $n^-$-type region each range from $1 \times 10^{13}/cm^3$ to $1 \times 10^7/cm^3$.

Preferably, the region 3 is the $p^+$-type region. More preferably, the impurity element contained in the $p^+$-type region is boron. Still more preferably, the concentration of boron in the region 3 is $1 \times 10^{18}/cm^3$ or more.

The semiconductor substrate 1 for use in the invention further needs to be provided with a porous single crystal layer 5 in an inner region 4 on the backside.

As illustrated in FIG. 1, the porous single crystal layer 5 is provided in the inner region 4 on the backside of the semiconductor substrate 1.

Figure 2:
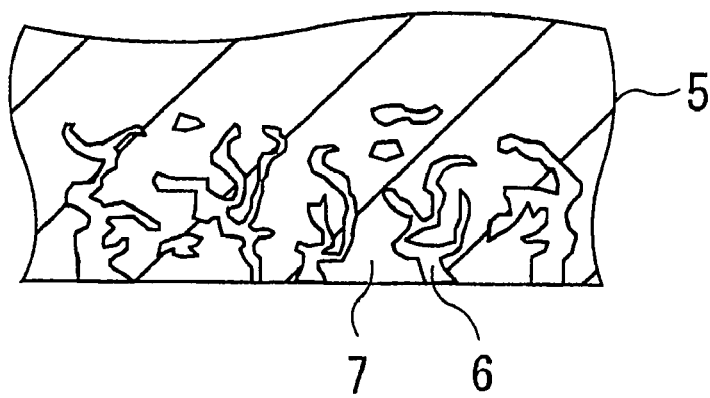
FIG. 2 is a schematic principal-part sectional view showing an enlarged porous single crystal layer.

FIG. 2 is an enlarged view of the porous single crystal layer 5 of FIG. 1. As illustrated in FIG. 2, the porous single crystal layer 5 is comprised of erosion holes 6 extending continuously from the backside of the semiconductor substrate 1 in an inward direction of the semiconductor chip, oxide films (not shown) formed on surfaces of the erosion holes 6, and a single crystal portion 7.

The single crystal portion 7 originates from the semiconductor wafer portion, and for example, when a silicon wafer is used for the semiconductor wafer, means a silicon crystal portion of the inner region 4. Further, the oxide film is generally resulting from oxidation of the single crystal portion 7.

The single crystal portion 7 may include an impurity element. The impurity element is the same as described previously, and preferably, boron. More preferably, the concentration of boron is $1 \times 10^8/cm^3$ or more.

The thickness of the porous single crystal layer 5 preferably ranges from 0.02 μm to 5 μm as values from the backside of the semiconductor substrate with reference to the direction normal to the surface of the semiconductor substrate.

When the thickness from the backside is less than 0.02 μm, the reliability of the semiconductor chip tends to decrease, while when the thickness from the backside exceeds 5 μm, the semiconductor chip tends to fail.

It is more preferable that the thickness range from 0.1 μm to 0.5 μm as values from the backside of the semiconductor substrate.

In addition, without impairing the object of the invention, a portion where the porous single crystal layer is not provided partially may exist in the inner region 4 with a thickness of 5 μm or less from the backside of the semiconductor chip on the backside of the semiconductor substrate 1.

The ratio of the single crystal portion 7 relative to the total volume of the erosion holes 6, oxide films (not shown) and single crystal portion 7 in the porous single crystal layer 5 is preferably in the range of 25 to 95 percent by volume, more preferably in the range of 50 to 90 percent by volume, and still more preferably, in the range of 75 to 85 percent by volume.

When the range is less than 25 percent by volume, the semiconductor chip tends to fail easier due to lack of the strength of the backside of the semiconductor chip. When the range exceeds 95 percent by volume, the reliability of the semiconductor chip 1 tends to degrade.

Further, the ratio of the erosion holes 6 relative to the total volume of the erosion holes 6, oxide films (not shown) and single crystal portion 7 in the porous single crystal layer 5 is preferably in the range of 5 to 70 percent by volume, more preferably in the range of 5 to 45 percent by volume, and still more preferably, in the range of 10 to 20 percent by volume.

Described below is a method of manufacturing a semiconductor chip of the invention.

Figure 3:
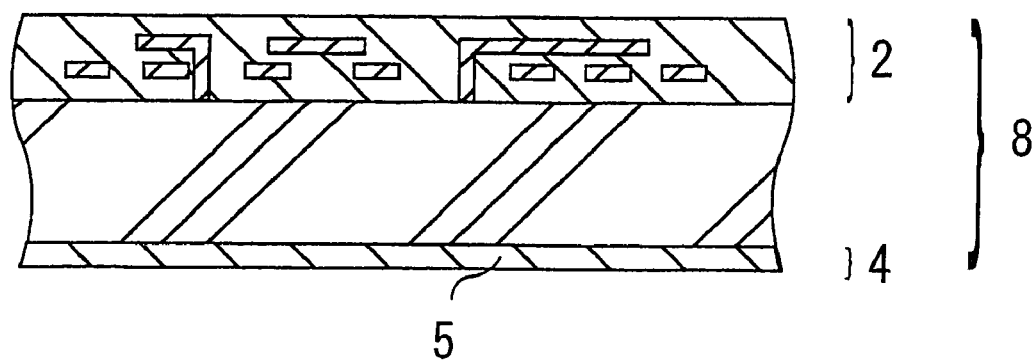
FIG. 3 is a schematic principal-part sectional view illustrating part of a processed semiconductor wafer.

To manufacture a semiconductor chip of the invention, for example, as shown in FIG. 3, required first is a step of forming the semiconductor device region 2 at a predetermined position on the main surface of the semiconductor wafer.

The semiconductor device region 2 is not limited to any formation methods unless the region is not of a structure for functioning as a semiconductor device such as, for example, memory device, logic device and the like, and can be formed according to generally performed methods.

For example, by combining one type or two types or more of methods such as thermal diffusion method performed using a deposition apparatus, drive-in apparatus and the like, ion implantation method performed using an ion implantation apparatus, annealing furnace and the like, and so on, it is possible to form the semiconductor device region 2 on the main surface of the semiconductor wafer.

Further, in addition to the impurity element and the like, it is possible to combine and perform one type or two types or more of operations such as formation of epitaxial layer, formation of insulation film, formation of electrode, formation of interlayer insulation film, formation of plug structure, formation of barrier layer, formation of metal wiring layer, formation of antireflection film, formation of passivation layer and the like as appropriate.

Conditions of the operations, conditions of the lithography technique in implementing the operations and the like are not limited particularly, and conditions generally adopted in manufacturing semiconductor chips can be selected as appropriate.

To manufacture the semiconductor chip of the invention, required next is a step of grinding the backside of the semiconductor wafer to a predetermined thickness.

The predetermined thickness generally ranges from 30 μm to 1500 μm, preferably from 50 μm to 300 μm, more preferably from 60 μm to 150 μm, and further preferably from 70 μm to 120 μm.

The method of grinding the backside of the semiconductor wafer is not limited particularly, and can be implemented according to a generally performed method.

In manufacturing the semiconductor chip of the invention, in addition to the grinding step, a step can be performed of further polish-finishing the backside of the semiconductor wafer.

The method of polish-finishing is not limited particularly, and can be implemented according to a generally performed method. More specifically, the method can be implemented by CMP and the like, for example.

Further, substituting for the step of polish-finishing, or after performing the step of polish-finishing, the back side of the semiconductor wafer can be etched.

The etching method is not limited particularly, and specifically, includes methods of dry etching, wet etching and like, for example. The etching method is preferably a method of wet etching.

For example, $HF/HNO_3$ aqueous solutions and the like may be used as etchants for use in the wet etching.

Among the HF/HNO$_3$ aqueous solutions are, for example, aqueous solutions with 49% HF aqueous solution and concentrated nitric acid mixed. In this case, it is preferable to use the concentrated nitric acid larger in volume than the 49% HF solution prior to mixing.

To manufacture the semiconductor chip of the invention, a step is required of providing the porous single crystal layer 5 in the inner region 4 on the backside of the semiconductor wafer.

Specifically, examples of the method of providing the porous single crystal layer 5 include a stain etching method, anodization method and the like.

In terms of characteristics and the like of the obtained semiconductor chip, the stain etching method is preferable as the method of providing the porous single crystal layer 5.

As the stain etching method, specific examples include a method of causing the HF/HNO$_3$ aqueous solution or the like to react with the backside of the semiconductor wafer and the like.

Among the HF/HNO$_3$ aqueous solutions are, for example, solutions with 49% HF aqueous solution and concentrated nitric acid mixed. In this case, it is preferable to make the volume of the concentrated nitric acid smaller than that of the 49% HF solution prior to mixing.

With reference to the volume prior to mixing, the ratio by volume of the 49% HF aqueous solution to concentrated nitric acid is preferably in the range between 10:1 and 5000:1.

It takes more time to perform stain etching as the ratio of HF is larger, and therefore, with reference to the volume prior to mixing, the ratio by volume of the 49% HF aqueous solution to concentrated nitric acid is more preferably in the range between 100:1 and 1000:1.

Further, it is possible to add surfactants such as NaNO$_2$ to the HF/HNO$_3$ aqueous solution. The amount of usage of the surfactant is generally in the range of 0.1 to 1 gram relative to a liter of the HF/HNO$_3$ solution.

The temperature in causing the HF/HNO$_3$ solution or the like to react with the backside of the semiconductor wafer generally ranges from 0 to 80° C.

When such temperature is less than 0° C., the rate of the stain etching tends to decrease. When such temperature exceeds 80° C., the operability of the stain etching tends to deteriorate.

The rate of the stain etching tends to increase, as the temperature increases. In terms of the operability of the stain etching, the temperature is preferably in the range of 40 to 80° C.

Further, it is necessary to apply light to the backside of the semiconductor wafer and the HF/HNO$_3$ solution or the like in causing the HF/HNO$_3$ solution or the like to react with the backside of the semiconductor wafer.

Examples of a source of the light include a mercury lamp, halogen lamp, arc lamp, fluorescent lamp and the like. The light source is preferably a fluorescent lamp.

The rate of the stain etching is, for example, specifically in the case of a silicon wafer, generally in the range of 1000 to 1500 nm/min. in the silicon wafer with the p$^+$-type region, in the range of 100 to 200 nm/min. in the silicon wafer with the p$^-$-type region, in the range of 200 to 300 nm/min. in the silicon wafer with the n$^+$-type region, and in the range of 200 to 300 nm/min in the silicon wafer with the n$^-$-type region, under conditions that the temperature is 30° C., the fluorescent lamp emits the light, and such an HF/HNO$_3$ aqueous solution is used that the ratio by volume of the 49% HF aqueous solution to concentrated nitric acid is 500:1 with reference to the volume prior to mixing.

By the above-mentioned stain etching method or the like, it is possible to form the erosion holes extending continuously from the backside of the semiconductor chip in an inward direction of the semiconductor chip. As illustrated in FIG. 2, the oxide film (not shown) is formed on the inner surface of the erosion hole 6 when the stain etching method is performed. In this way, as illustrated in FIG. 1, the porous single crystal layer 5 can be formed in the inner region 4 on the backside of the semiconductor chip 1.

After causing the HF/HNO$_3$ solution or the like to react with the backside of the semiconductor wafer and rinsing the backside of the semiconductor wafer with pure water, the semiconductor wafer can be dried by a method such as a method of heating, a method of using the centrifugal force by rotation, a method of blowing gas and the like.

Thus, as illustrated in FIG. 3, a processed semiconductor wafer 8 can be obtained which is provided with the impurity regions 2 at respective predetermined positions on the main surface and with the porous single crystal layer 5 in the inner portion 4 on the backside.

The semiconductor chip of the invention can be obtained by a step of dicing the processed semiconductor wafer 8.

In addition, the method of performing dicing is not limited particularly, and can be implemented according to generally performed conditions.

By using thus obtained semiconductor chip, it is possible to manufacture various semiconductor devices such as BGA, TCP, TSOP, TQFP and the like.

For example, in the case of BGA, the semiconductor chip is bonded on a BGA substrate with an adhesion tape or the like, wire boding operation is then performed, the semiconductor chip is sealed with a semiconductor sealing resin, soldering bolls are provided appropriately, and BGA is thereby obtained on which is mounted the semiconductor chip of the invention.

The above-mentioned semiconductor devices as well as BGA can be obtained according to generally performed methods, as in the aforementioned case.

[Effect]

The semiconductor chip of the present invention has the porous single crystal layer 5 as illustrated in FIG. 1 on the backside. Therefore, even when the stress is applied to the semiconductor device, as illustrated in FIG. 2, the stress is relaxed by the single crystal portion 7 existing between the erosion holes 6 provided in the porous single crystal layer, thereby preventing the failure of the semiconductor chip.

Further, as illustrated in FIG. 2, the erosion holes 6 and the oxide films (not shown) provided on the surfaces of the erosion holes 6 effectively serve as a gettering layer. Therefore, even in the case where metal is adhered to the backside of the semiconductor chip or the like, the metal can be prevented from diffusing and/or becoming solid solution inside the semiconductor chip and thereby reaching the semiconductor device region 2 on the main surface of the semiconductor chip.

It is thereby possible to provide the semiconductor chip with high reliability that prevents the semiconductor device from malfunctioning when the semiconductor chip is incorporated into the semiconductor device.

Details of the present invention will be described below more specifically with reference to examples, but the invention is not limited to any of the examples.

Example 1

Figure 4:
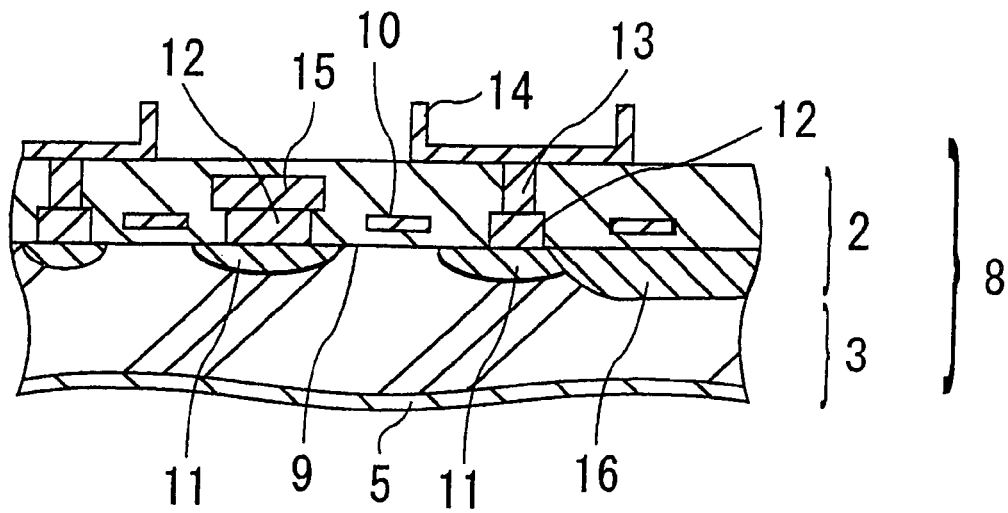
FIG. 4 is a schematic principal-part sectional view illustrating part of a processed semiconductor wafer (Example 1)

Using a silicon wafer containing 1×10$^{15}$/cm$^3$ of boron, as shown in FIG. 4, the semiconductor device region 2 functioning as DRAM was provided on the main surface of the silicon wafer. While FIG. 4 shows only a memory cell portion as the semiconductor device region 2 for the sake of convenience, basic structures as DRAM such as peripheral circuits are naturally provided adjacent to the memory cell portion.

The memory cell portion is comprised of cell transistors each having a gate oxide film 9, gate electrode 10 and diffusion layer 11, capacitors 14 connected via plugs 12 and 13 formed on the diffusion layers 11, and bit lines 15 connected via the plugs 12. In addition, the cell transistors are electrically isolated by shallow groove element isolation 16.

After preparing the semiconductor device region 2 functioning as DRAM, a rough grinding process was performed on the backside of the silicon wafer using a semiconductor wafer grinding apparatus equipped with a grindstone with a grain size of #400 mesh, and the silicon wafer was ground to a thickness of 160 μm.

Then, a finish grinding process was performed on the backside of the silicon wafer using a semiconductor wafer grinding apparatus equipped with a grindstone with a grain size of #2000 mesh, and the silicon wafer was ground to a thickness of 140 μm.

Next, spin etching was performed on the backside of the silicon wafer for 1 minute at an etching rate of 40 μm/min., using the HF/HNO$_3$ based etchant as described above. Then, spin etching was performed on the backside of the silicon wafer for 10 seconds at an etching rate of 10 μm/min., using the HF/HNO$_3$ based etchant as described above. Subsequently, the etchant was rinsed with pure water and removed. At this point, the thickness of the silicon wafer was 100 μm.

Then, spin etching was performed on the backside of the silicon wafer for 1 minute using the HF/HNO$_3$ based stain etchant under irradiation of a fluorescent lamp. The porous single crystal layer 5 was thereby formed on the backside of the silicon wafer. Next, the etchant was rinsed with pure water and removed, and the processed silicon wafer 8 was obtained.

Further, by dicing the processed silicon wafer 8, semiconductor chips a were obtained.

In addition, in FIG. 4, smooth asperities existing on the backside of the semiconductor chip a were emphasized for the sake of convenience.

Next, using the semiconductor chips a, semiconductor devices were prepared by a semiconductor device assembly process as described below.

First, the semiconductor chip a was bonded to a BGA substrate. Next, by a wire bonding process, wiring was provided between the semiconductor chip a and the BGA substrate.

Then, the BGA substrate with the semiconductor chip a bonded thereto was mounted on a mold, sealing was performed with a transfer molding apparatus using a thermosetting resin composition for semiconductor sealing in the temperature range of 175 to 190° C., soldering balls were provided, and a BGA semiconductor device A was obtained.

The defective occurrence rate of information retention characteristics of the BGA semiconductor device A was tested under certain conditions. The result is shown in Table 1.

Example 2

Figure 5:
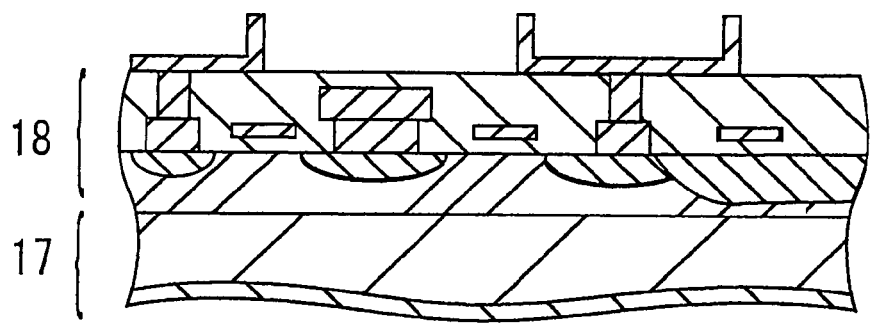
FIG. 5 is a schematic principal-part sectional view illustrating part of a processed semiconductor wafer (Example 2)

Semiconductor chips b and BGA semiconductor devices B were obtained in the same operation as in Example 1, except that substituting for the silicon wafer containing $1 \times 10^{15}/cm^3$ of boron, such a substrate was used that an epitaxial growth layer 18 with a thickness of 5 μm containing $1 \times 10^{15}/cm^3$ of boron was provided on a base silicon substrate 17 containing $3 \sim 7 \times 10^{18}/cm^3$ of boron as shown in FIG. 5.

In addition, in FIG. 5, smooth asperities existing on the backside of the semiconductor chip b were emphasized for the sake of convenience.

The defective occurrence rate of information retention characteristics of the BGA semiconductor device B was tested under the same conditions as in Example 1. The result is shown in Table 1.

Example 3

Figure 6:
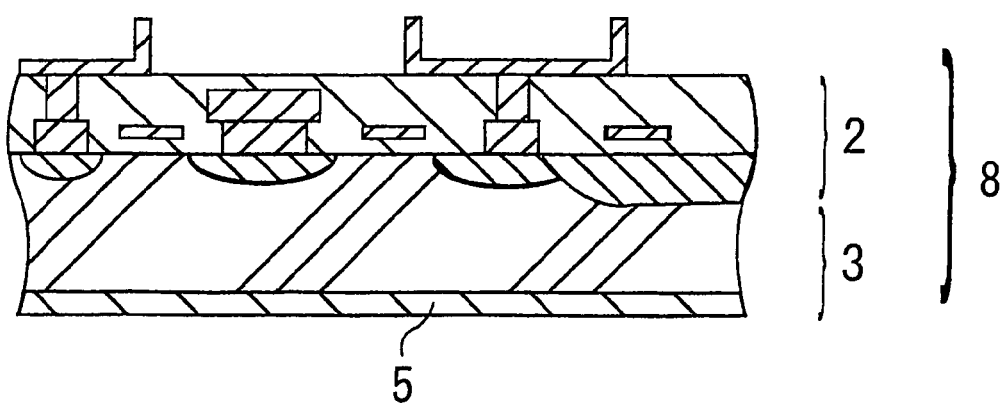
FIG. 6 is a schematic principal-part sectional view illustrating part of a processed semiconductor wafer (Example 3)

Using a silicon wafer containing $1 \times 10^{15}/cm^3$ of boron, as shown in FIG. 6, the semiconductor device region 2 functioning as DRAM was provided on the main surface of the silicon wafer as in Example 1.

After preparing the semiconductor device region 2 functioning as DRAM, the rough grinding process was performed on the backside of the silicon wafer using the semiconductor wafer grinding apparatus equipped with the grindstone with a grain size of #400 mesh, and the silicon wafer was ground to a thickness of 162 μm.

Then, the finish grinding process was performed on the backside of the silicon wafer using the semiconductor wafer grinding apparatus equipped with the grindstone with a grain size of #2000 mesh, and the silicon wafer was ground to a thickness of 102 μm.

Next, a polish-finishing process was performed on the backside of the silicon wafer. The thickness of the silicon wafer obtained by this operation was 100 μm.

Ground damage on the backside of the silicon wafer generated by the rough grinding process and the finish grinding process was almost removed, but cracks on the backside of the silicon wafer generated by the rough grinding process and the finish grinding process were not completely removed by the polish-finishing process for grinding the backside of the silicon wafer by 2 μm.

Then, spin etching was performed on the backside of the silicon wafer for 1 minute using the HF/HNO$_3$ based stain etchant under irradiation of the fluorescent lamp. The porous single crystal layer 5 was thereby formed on the backside of the silicon wafer. Next, the etchant was rinsed with pure water and removed, and the processed silicon wafer 8 was obtained.

Further, by dicing the processed silicon wafer 8, semiconductor chips c were obtained.

Next, using the semiconductor chips c, semiconductor devices were prepared by the semiconductor device assembly process as described below.

First, the semiconductor chip c was bonded to a BGA substrate. Next, by the wire bonding process, wiring was provided between the semiconductor chip c and the BGA substrate.

Then, the BGA substrate with the semiconductor chip c bonded thereto was mounted on the mold, sealing was performed with the transfer molding apparatus using the thermosetting resin composition for semiconductor sealing in the temperature range of 175 to 190° C., soldering balls were provided, and a BGA semiconductor device C was obtained.

The defective occurrence rate of information retention characteristics of the BGA semiconductor device C was tested under the same conditions as in Example 1. The result is shown in Table 1.

Example 4

Figure 7:
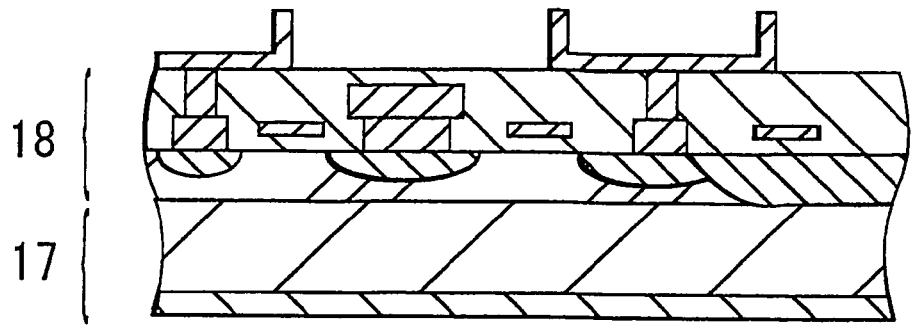
FIG. 7 is a schematic principal-part sectional view illustrating part of a processed semiconductor wafer (Example 4)

Semiconductor chips d and BGA semiconductor devices D were obtained in the same operation as in Example 3, except that substituting for the silicon wafer containing $1 \times 10^{15}/cm^3$ of boron, such a substrate was used that the epitaxial growth layer 18 with a thickness of 5 μm containing $1\times10^{15}/cm^3$ of boron was provided on the base silicon substrate 17 containing $3\sim7\times10^{18}/cm^3$ of boron as shown in FIG. 7.

The defective occurrence rate of information retention characteristics of the BGA semiconductor device D was tested under the same conditions as in Example 1. The result is shown in Table 1.

Example 5

Figure 8:
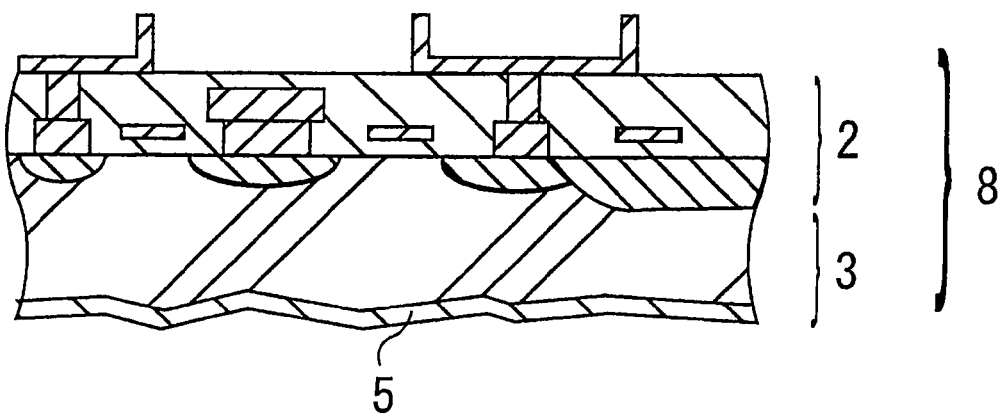
FIG. 8 is a schematic principal-part sectional view illustrating part of a processed semiconductor wafer (Example 5)

Using a silicon wafer containing $1\times10^{15}/cm^3$ of boron, as shown in FIG. 8, the semiconductor device region 2 functioning as DRAM was provided on the main surface of the silicon wafer as in Example 1.

After preparing the semiconductor device region 2 functioning as DRAM, the rough grinding process was performed on the backside of the silicon wafer using the semiconductor wafer grinding apparatus equipped with the grindstone with a grain size of #400 mesh, and the silicon wafer was ground to a thickness of 120 μm.

Then, the finish grinding process was performed on the backside of the silicon wafer using the semiconductor wafer grinding apparatus equipped with the grindstone with a grain size of #2000 mesh, and the silicon wafer was ground to a thickness of 100 μm.

Next, spin etching was performed on the backside of the silicon wafer for 1 minute using the $HF/HNO_3$ based stain etchant under irradiation of the fluorescent lamp. The porous single crystal layer 5 was thereby formed on the backside of the silicon wafer. Next, the etchant was rinsed with pure water and removed, and the processed silicon wafer 8 was obtained.

Further, by dicing the processed silicon wafer 8, semiconductor chips e were obtained.

In addition, in FIG. 8, asperities with corners existing on the backside of the semiconductor chip e were emphasized for the sake of convenience.

Next, using the semiconductor chips e, semiconductor devices were prepared by the semiconductor device assembly process as described below.

First, the semiconductor chip e was bonded to a BGA substrate. Next, by the wire bonding process, wiring was provided between the semiconductor chip and the BGA substrate.

Then, the BGA substrate with the semiconductor chip e bonded thereto was mounted on the mold, sealing was performed with the transfer molding apparatus using the thermosetting resin composition for semiconductor sealing in the temperature range of 175 to 190° C., soldering balls were provided, and a BGA semiconductor device E was obtained.

The defective occurrence rate of information retention characteristics of the BGA semiconductor device E was tested under the same conditions as in Example 1. The result is shown in Table 1.

Example 6

Figure 9:
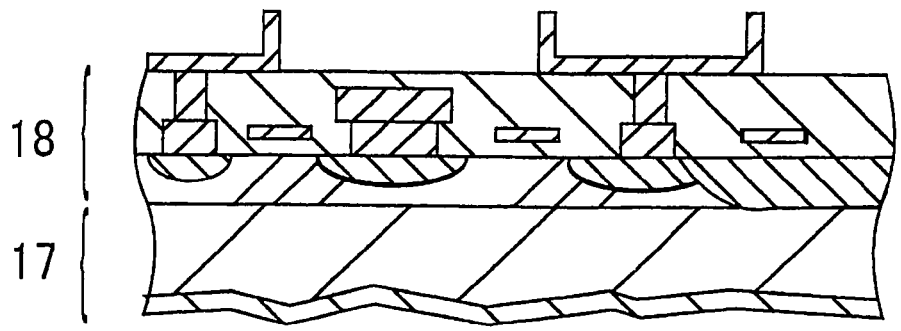
FIG. 9 is a schematic principal-part sectional view illustrating part of a processed semiconductor wafer (Example 6)

Semiconductor chips f and BGA semiconductor devices F were obtained in the same operation as in Example 5, except that substituting for the silicon wafer containing $1\times10^{15}/cm^3$ of boron, such a substrate was used that the epitaxial growth layer 18 with a thickness of 5 μm containing $1\times10^{15}/cm^3$ of boron was provided on the base silicon substrate 17 containing $3\sim7\times10^{18}/cm^3$ of boron as shown in FIG. 9.

In addition, in FIG. 9, asperities with corners existing on the backside of the semiconductor chip f were emphasized for the sake of convenience.

The defective occurrence rate of information retention characteristics of the BGA semiconductor device F was tested under the same conditions as in Example 1. The result is shown in Table 1.

Example 7

A plurality of semiconductor chips with same outer shapes as in semiconductor chips a to f were prepared in the same operation as in manufacturing the semiconductor chips a to f described in Examples 1 to 6, respectively, and mechanical strengths of the chips were tested. Assuming the mechanical strength as "1" of a semiconductor chip of the same outer shape without the porous single crystal layer, the relative relationship was studied between the mechanical strength of each of the plurality of semiconductor chips and a ratio of the single crystal portion 7 to the total volume of the single crystal portion 7, erosion holes 6 and oxide films (not shown) in the porous single crystal layer 5 as shown in FIG. 2.

Figure 10:
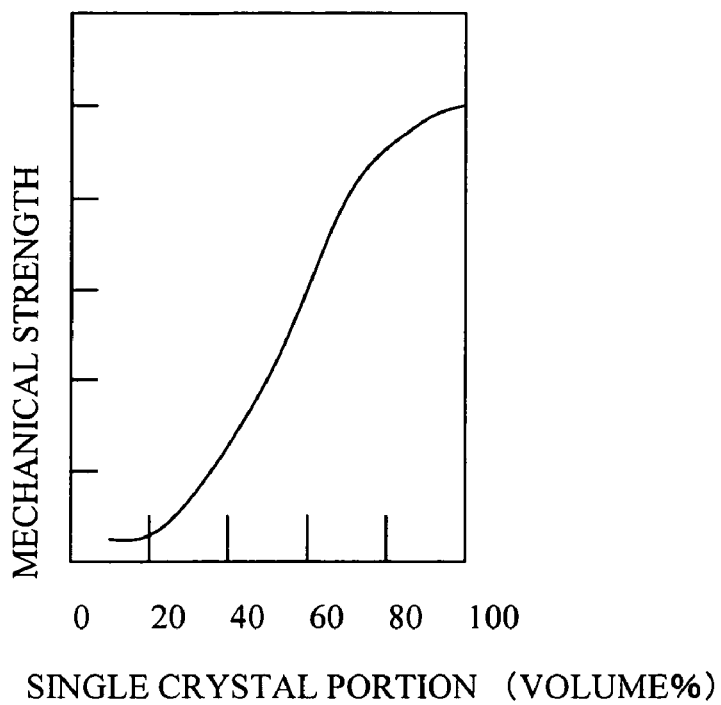
FIG. 10 is a graph showing a relative relationship between the mechanical strength of a semiconductor chip of the invention and a ratio of a single crystal portion in a porous single crystal layer of the semiconductor chip.

The relative relationship between the mechanical strength and the ratio showed the tendency as shown in the graph of FIG. 10.

Example 8

A plurality of semiconductor chips with same outer shapes as in semiconductor chips a to f were prepared in the same operation as in manufacturing the semiconductor chips a to f described in Examples 1 to 6, respectively, and the blocking force was tested to metal such as copper adhered to the backside of the semiconductor chip in manufacturing the semiconductor chip.

Herein, the blocking force was determined to be "0", when an amount of metal such as copper was assumed "1" which reached the impurity region provided on the main surface of the semiconductor substrate without the porous single crystal layer 5 as shown in FIG. 2 in the case that an amount of the metal such as copper adhered to the backside of the semiconductor chip was made constant, and that the semiconductor chip was heated at 200° C. for certain time. Further, the blocking force was determined to be "1" when the amount of the metal such as copper was "0".

In addition, the total amount of the metal such as copper first adhered to the backside of the semiconductor chip was made a constant amount for each test.

Accordingly, under the same conditions, for example, the blocking force is estimated "0.7" when the amount of the metal such as copper reaching the impurity region is "0.3", while being estimated "0.3" when the amount of the metal such as copper reaching the impurity region is "0.7".

In addition, the amount of metal such as copper was examined by total reflection X-ray fluorescence analysis method, but the same results may be obtained using any methods that is means for measuring the amount of metal such as copper.

Estimation of the blocking force below is the same as in the forgoing.

The relative relationship was studied between the blocking force with reference to the foregoing and a ratio of the single crystal portion 7 to the total volume of the single crystal portion 7, erosion holes 6 and oxide films (not shown) in the porous single crystal layer 5 as shown in FIG. 2.

Figure 11:
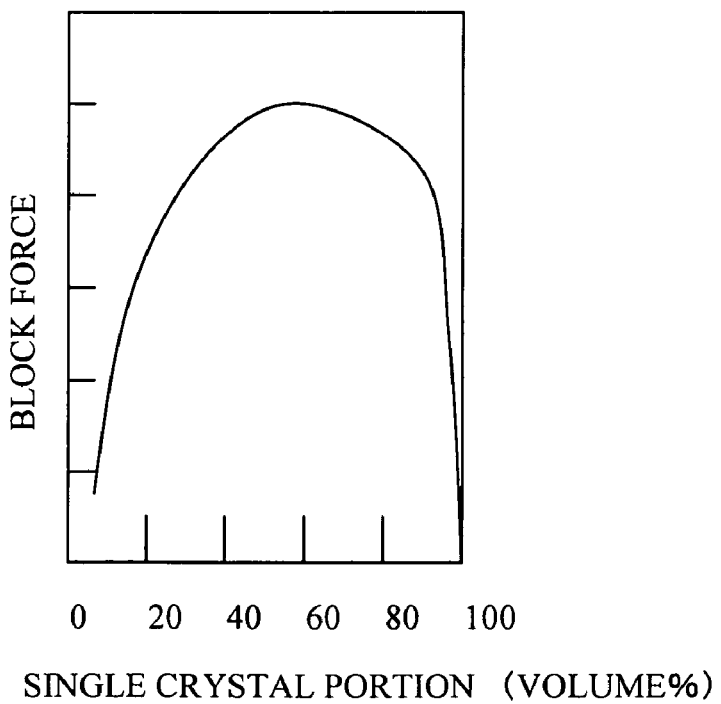
FIG. 11 is a graph showing a relative relationship between the blocking force to metal of the semiconductor chip of the invention and the ratio of the single crystal portion in the porous single crystal layer of the semiconductor chip.

The relative relationship between the blocking force and the ratio showed the tendency as shown in the graph of FIG. 11.

Example 9

A plurality of semiconductor chips with same outer shapes as in semiconductor chips a to f were prepared in the same operation as in manufacturing the semiconductor chips a to f described in Examples 1 to 6, respectively, and the metal capturing force was tested to metal such as copper adhered to the backside of the semiconductor chip in manufacturing the semiconductor chip.

Herein, the metal capturing force is a rate of an amount of metal such as copper existing in the porous single crystal layer of the semiconductor substrate relative to a total distribution amount of metal such as copper which is assumed "1" when a distribution state of the metal such as copper is examined in the section of the semiconductor substrate with reference to a direction normal to the surface of the semiconductor substrate. Estimation of the metal capturing force below is the same as in the forgoing.

In addition, the amount of metal such as copper was examined by total reflection X-ray fluorescence analysis method, but the same results may be obtained using any methods that is means for measuring the amount of metal such as copper.

The relative relationship was studied between the metal capturing force to metal such as copper and a ratio of the single crystal portion 7 to the total volume of the single crystal portion 7, erosion holes 6 and oxide films (not shown) in the porous single crystal layer 5 as shown in FIG. 2.

Figure 12:
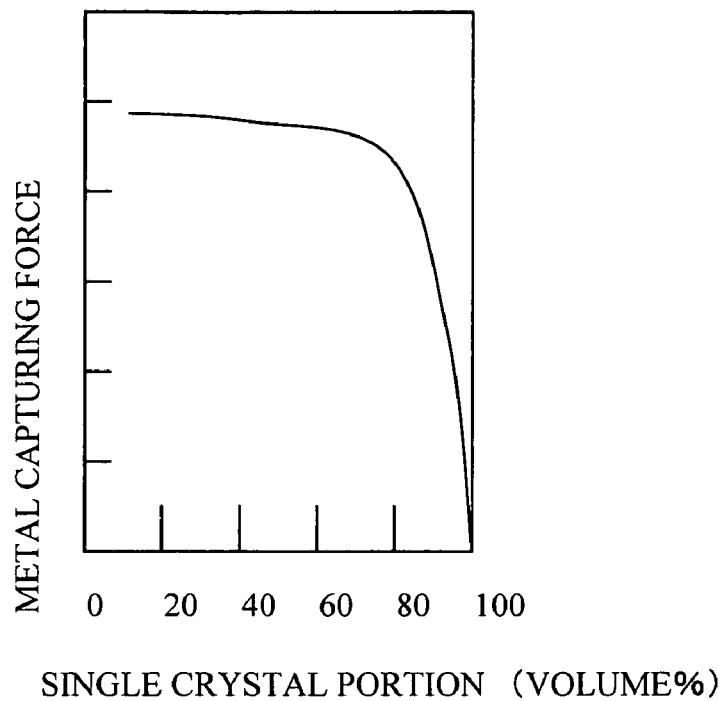
FIG. 12 is a graph showing a relative relationship between the metal capturing force of the semiconductor chip of the invention and the ratio of the single crystal portion in the porous single crystal layer of the semiconductor chip.

The relative relationship between the metal capturing force and the ratio showed the tendency as shown in the graph of FIG. 12.

Example 10

A plurality of semiconductor chips with same outer shapes as in semiconductor chips a to f were prepared in the same operation as in manufacturing the semiconductor chips a to f described in Examples 1 to 6, respectively, and mechanical strengths of the chips were tested. Assuming the mechanical strength as "1" of a semiconductor chip of the same outer shape without the porous single crystal layer, the relative relationship was studied between the mechanical strength of each of the plurality of semiconductor chips and a ratio of the erosion holes 6 to the total volume of the single crystal portion 7, erosion holes 6 and oxide films (not shown) in the porous single crystal layer 5 as shown in FIG. 2.

Figure 13:
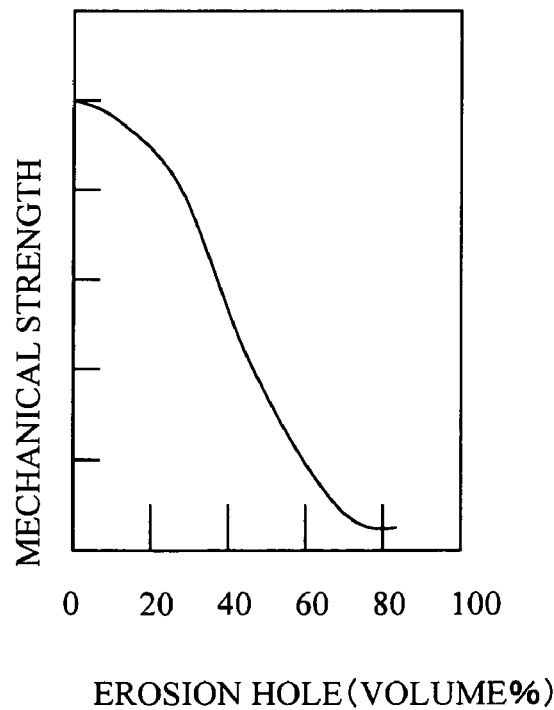
FIG. 13 is a graph showing a relative relationship between the mechanical strength of the semiconductor chip of the invention and a ratio of erosion holes in the porous single crystal layer of the semiconductor chip.

The relative relationship between the mechanical strength and the ratio showed the tendency as shown in the graph of FIG. 13.

Example 11

A plurality of semiconductor chips with same outer shapes as in semiconductor chips a to f were prepared in the same operation as in manufacturing the semiconductor chips a to f described in Examples 1 to 6, respectively, and the blocking force was tested to metal such as copper adhered to the backside of the semiconductor substrate in the semiconductor chip in manufacturing the semiconductor chip.

The relative relationship was studied between the blocking force and a ratio of the erosion holes 6 to the total volume of the single crystal portion 7, erosion holes 6 and oxide films (not shown) in the porous single crystal layer 5 as shown in FIG. 2.

Figure 14:
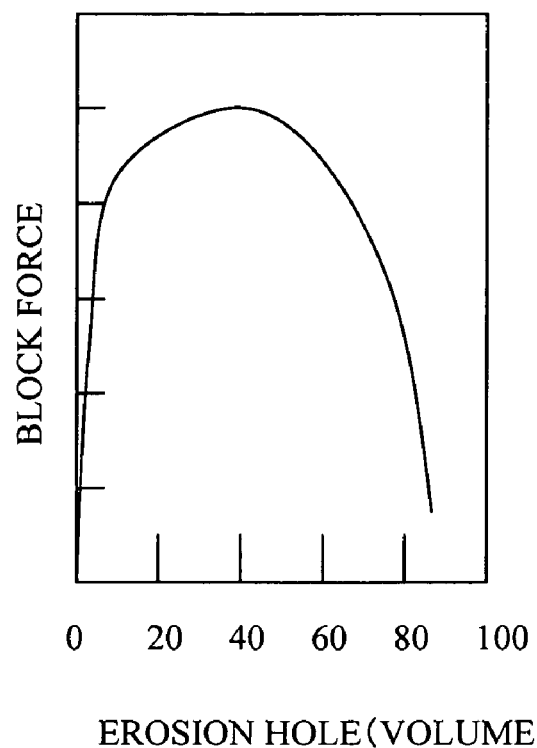
FIG. 14 is a graph showing a relative relationship between the blocking force to metal of the semiconductor chip of the invention and the ratio of erosion holes in the porous single crystal layer of the semiconductor chip.

The relative relationship between the blocking force and the ratio showed the tendency as shown in the graph of FIG. 14.

Example 12

A plurality of semiconductor chips with same outer shapes as in semiconductor chips a to f were prepared in the same operation as in manufacturing the semiconductor chips a to f described in Examples 1 to 6, respectively, and the metal capturing force was tested to metal such as copper adhered to the backside of the semiconductor substrate in the semiconductor chip in manufacturing the semiconductor chip.

The relative relationship was studied between the metal capturing force to metal such as copper and a ratio of the erosion holes 6 to the total volume of the single crystal portion 7, erosion holes 6 and oxide films (not shown) in the porous single crystal layer 5 as shown in FIG. 2.

Figure 15:
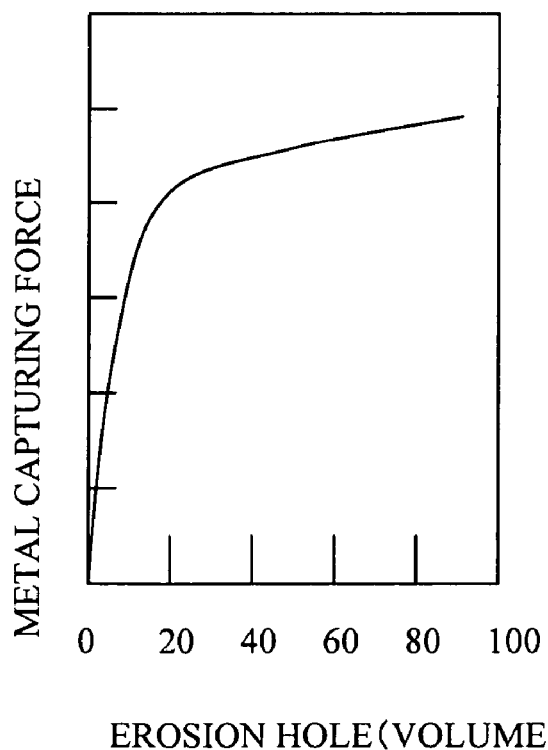
FIG. 15 is a graph showing a relative relationship between the metal capturing force of the semiconductor chip of the invention and the ratio of erosion holes in the porous single crystal layer of the semiconductor chip.

The relative relationship between the metal capturing force and the ratio showed the tendency as shown in the graph of FIG. 15.

Example 13

A plurality of semiconductor chips with same outer shapes as in semiconductor chips a to f were prepared in the same operation as in manufacturing the semiconductor chips a to f described in Examples 1 to 6, respectively, and mechanical strengths of the chips were tested. Assuming the mechanical strength as "1" of a semiconductor chip of the same outer shape without the porous single crystal layer, the relative relationship was studied between the mechanical strength of each of the plurality of semiconductor chips and a thickness of the porous single crystal layer 5 as shown in FIG. 2.

Figure 16:
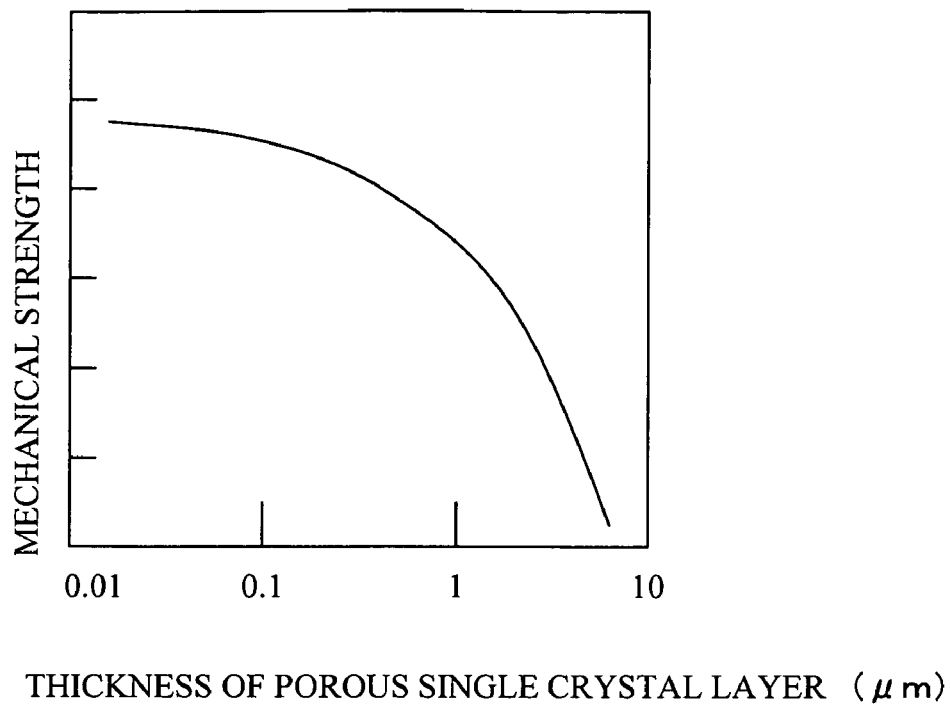
FIG. 16 is a graph showing a relative relationship between the mechanical strength of the semiconductor chip of the invention and a thickness of the porous single crystal layer of the semiconductor chip.

The relative relationship between the mechanical strength and the thickness showed the tendency as shown in the graph of FIG. 16.

Example 14

A plurality of semiconductor chips with same outer shapes as in semiconductor chips a to f were prepared in the same operation as in manufacturing the semiconductor chips a to f described in Examples 1 to 6, respectively, and the blocking force was tested to metal such as copper adhered to the backside of the semiconductor substrate in the semiconductor chip in manufacturing the semiconductor chip.

The relative relationship was studied between the blocking force and a thickness of the porous single crystal layer 5 as shown in FIG. 2.

Figure 17:
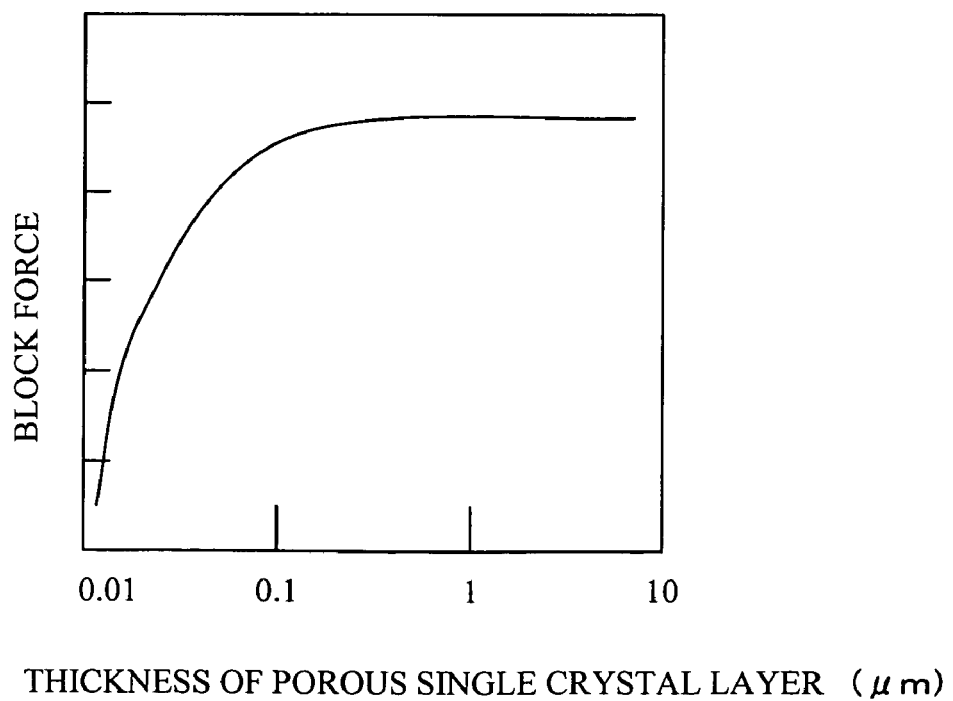
FIG. 17 is a graph showing a relative relationship between the blocking force to metal of the semiconductor chip of the invention and the thickness of the porous single crystal layer of the semiconductor chip.

The relative relationship between the blocking force to metal and the thickness showed the tendency as shown in the graph of FIG. 17.

Example 15

A plurality of semiconductor chips with same outer shapes as in semiconductor chips a to f were prepared in the same operation as in manufacturing the semiconductor chips a to f described in Examples 1 to 6, respectively, and the metal capturing force was tested to metal such as copper adhered to the backside of the semiconductor chip in manufacturing the semiconductor chip.

The relative relationship was studied between the metal capturing force to metal such as copper and a thickness of the porous single crystal layer 5 as shown in FIG. 2.

Figure 18:
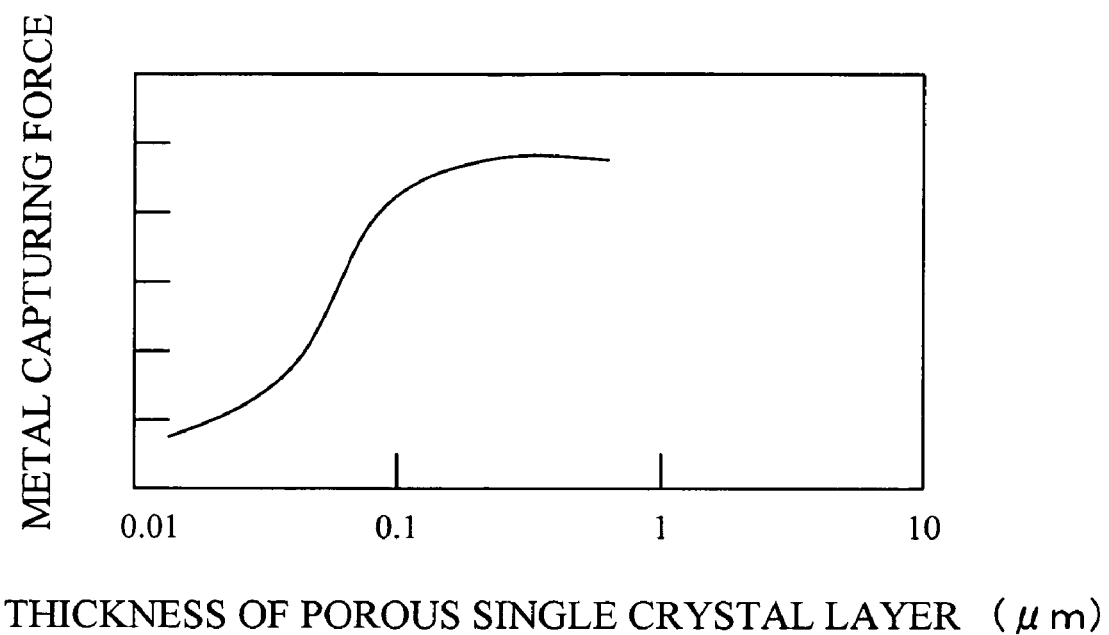
FIG. 18 is a graph showing a relative relationship between the metal capturing force of the semiconductor chip of the invention and the thickness of the porous single crystal layer of the semiconductor chip.

The relative relationship was studied between the metal capturing force and the thickness showed the tendency as shown in the graph of FIG. 18.

Comparative Example 1

Semiconductor chips g and BGA semiconductor devices G were obtained in the same operation as in Example 1 except that spin etching with the HF/HNO$_3$ based stain etchant was omitted and the porous single crystal layer was not formed.

The defective occurrence rate of information retention characteristics of the BGA semiconductor device G was tested under the same conditions as in Example 1. The result is shown in Table 1.

Comparative Example 2

Semiconductor chips h and BGA semiconductor devices H were obtained in the same operation as in Example 2 except that spin etching with the HF/HNO$_3$ based stain etchant was omitted and the porous single crystal layer was not formed.

The defective occurrence rate of information retention characteristics of the BGA semiconductor device H was tested under the same conditions as in Example 1. The result is shown in Table 1.

Comparative Example 3

Semiconductor chips i and BGA semiconductor devices I were obtained in the same operation as in Example 3 except that spin etching with the HF/HNO$_3$ based stain etchant was omitted and the porous single crystal layer was not formed.

The defective occurrence rate of information retention characteristics of the BGA semiconductor device I was tested under the same conditions as in Example 1. The result is shown in Table 1.

Comparative Example 4

Semiconductor chips j and BGA semiconductor devices J were obtained in the same operation as in Example 4 except that spin etching with the HF/HNO$_3$ based stain etchant was omitted and the porous single crystal layer was not formed.

The defective occurrence rate of information retention characteristics of the BGA semiconductor device J was tested under the same conditions as in Example 1. The result is shown in Table 1.

Comparative Example 5

Semiconductor chips k and BGA semiconductor devices K were obtained in the same operation as in Example 5 except that spin etching with the HF/HNO$_3$ based stain etchant was omitted and the porous single crystal layer was not formed.

The defective occurrence rate of information retention characteristics of the BGA semiconductor device K was tested under the same conditions as in Example 1. The result is shown in Table 1.

Comparative Example 6

Semiconductor chips 1 and BGA semiconductor devices L were obtained in the same operation as in Example 6 except that spin etching with the HF/HNO$_3$ based stain etchant was omitted and the porous single crystal layer was not formed.

The defective occurrence rate of information retention characteristics of the BGA semiconductor device L was tested under the same conditions as in Example 1. The result is shown in Table 1.

TABLE 1

| With the porous single crystal layer | | Without the porous single crystal layer | |
| --- | --- | --- | --- |
| Example 1 | 0.20% | Comparative example 1 | 0.5% |
| Example 2 | 0% | Comparative example 2 | 0.2% |
| Example 3 | 0.30% | Comparative example 3 | 1.0% |
| Example 4 | 0.05% | Comparative example 4 | 0.6% |
| Example 5 | 0.10% | Comparative example 5 | 0.6% |
| Example 6 | 0.07% | Comparative example 6 | 0.3% |

Reference Example

As reference examples, shown are data of the porous single crystal layer for use in the invention.

Figure 19:
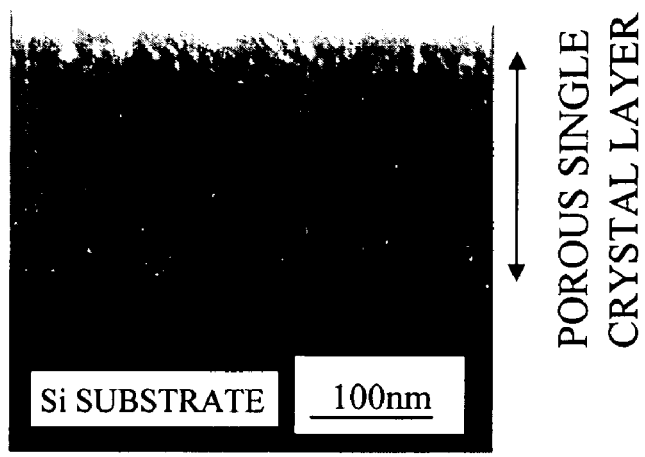
FIG. 19 is a drawing-substitute photograph of a section of the porous single crystal layer taken by an electron microscope (TEM)

FIG. 19 is a drawing-substitute photograph of a section of the porous single crystal layer, taken by an electron microscope (TEM), provided in the p$^-$-type region on the backside of a semiconductor silicon substrate for use in the invention.

A portion under the porous single crystal layer in FIG. 19 shows the semiconductor silicon substrate.

Figure 20:
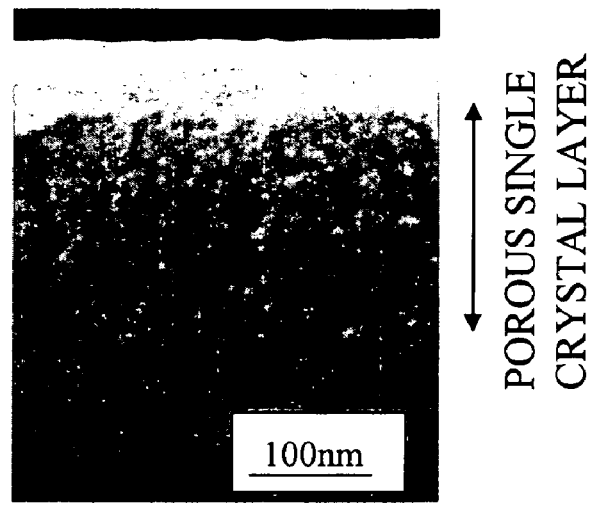
FIG. 20 is a drawing-substitute photograph of a section of the porous single crystal layer taken by an electron microscope (SEM)

FIG. 20 is a drawing-substitute photograph of a section of the porous single crystal layer, taken by an electron microscope (SEM), provided in the p$^-$-type region on the backside of the semiconductor silicon substrate for use in the invention.

Figure 21:
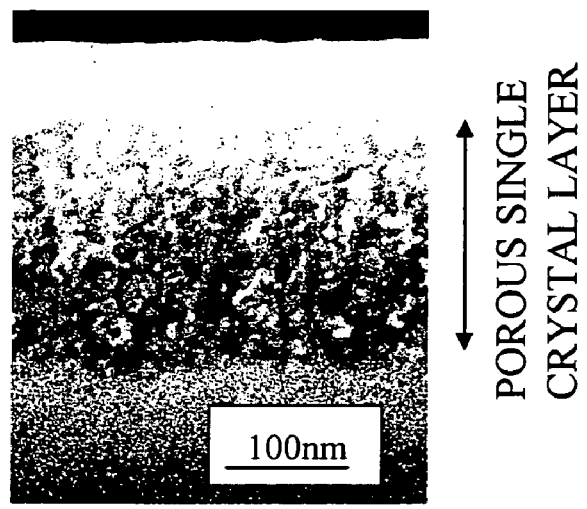
FIG. 21 is a drawing-substitute photograph with contrast of FIG. 20 enhanced.

FIG. 21 is a drawing-substitute photograph of the section of the porous single crystal layer, taken by the electron microscope (SEM), provided in the p$^-$-type region on the backside of the semiconductor silicon substrate for use in the invention, with contrast of FIG. 20 enhanced.

Figure 22:
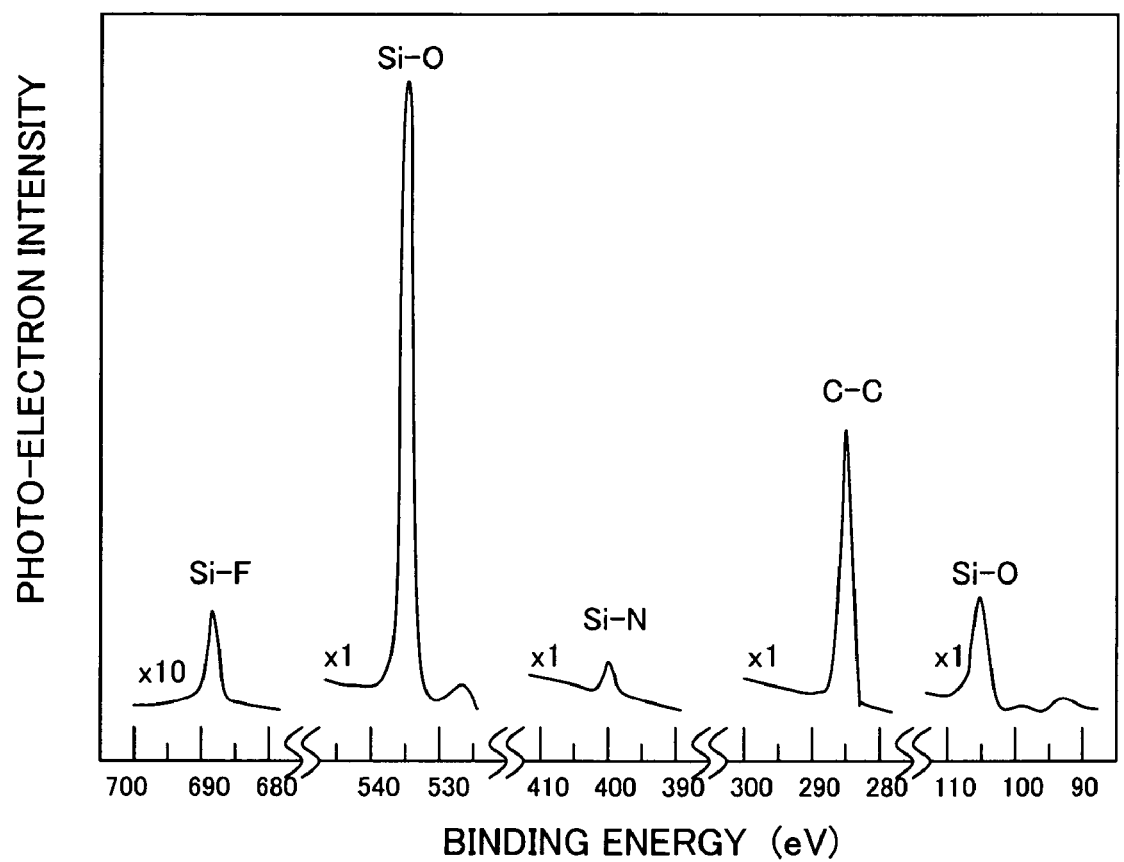
FIG. 22 is a chart showing a result of XPS analysis of the porous single crystal layer.

FIG. 22 is a chart showing a result of XPS analysis of the porous single crystal layer provided in the p$^-$-type region on the backside of the semiconductor silicon substrate for use in the invention.

The vertical axis represents intensity of photo-electron, while the horizontal axis represents binding energy (eV) between atoms.

Figure 23:
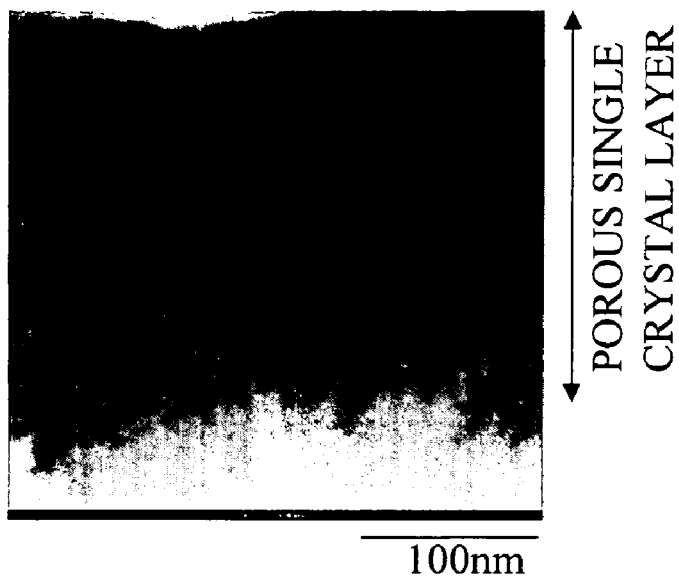
FIG. 23 is a drawing-substitute photograph of a section of the porous single crystal layer taken by an electron microscope (TEM)

FIG. 23 is a drawing-substitute photograph of a section of the porous single crystal layer, taken by an electron microscope (TEM), provided in the p$^+$-type region on the backside of a semiconductor silicon substrate for use in the invention.

A portion under the porous single crystal layer in FIG. 23 shows the semiconductor silicon substrate.

Figure 24:
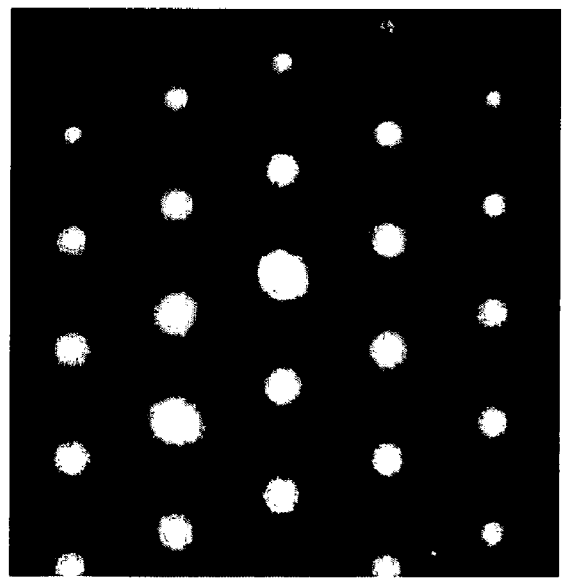
FIG. 24 is a drawing-substitute photograph of an electron diffraction image of the porous single crystal layer.

FIG. 24 is a drawing-substitute photograph of an electron diffraction image of the porous single crystal layer provided in the p$^+$-type region on the backside of the semiconductor silicon substrate for use in the invention.

Figure 25:
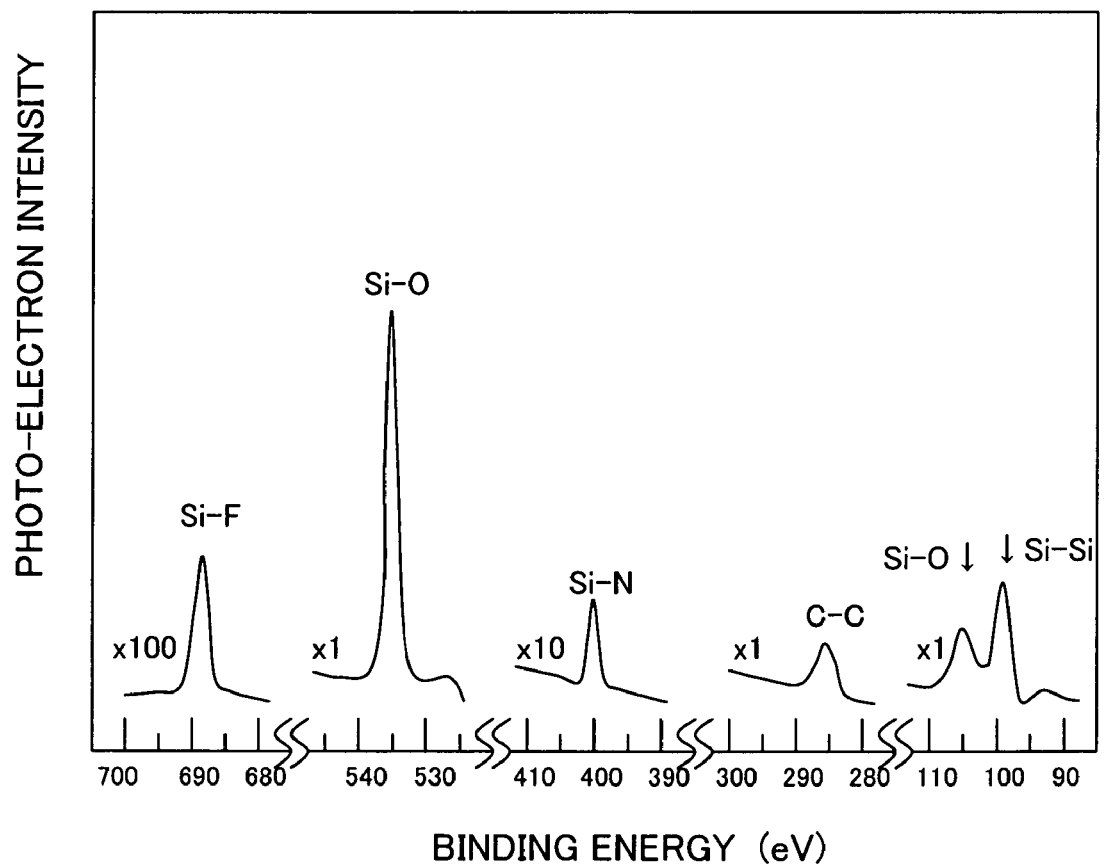
FIG. 25 is a chart showing a result of XPS analysis of the porous single crystal layer.

FIG. 25 is a chart showing a result of XPS analysis of the porous single crystal layer provided in the p$^+$-type region on the backside of the semiconductor silicon substrate for use in the invention.

The vertical axis represents intensity of photo-electron, while the horizontal axis represents binding energy (eV) between atoms.

FIG. 26 is a table summarizing results of XPS analysis on the porous single crystal layers in FIGS. 22 and 25.

This application is based on the Japanese Patent applications Nos.: 2005-070152 filed on Mar. 11, 2005 and 2005-361123 filed on Dec. 14, 2005, entire content of which is expressly incorporated by reference herein.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method of manufacturing a semiconductor chip where the method includes steps (1) to (4) and step (3) includes a stain etching method, comprising the steps:
   (1) forming semiconductor device regions at respective positions on a main surface of a semiconductor wafer;
   (2) grinding the back side of the semiconductor wafer to a predetermined thickness;
   (3) providing a porous single crystal layer on the backside of the semiconductor wafer, wherein
   the stain etching method is performed by causing a $HF/HNO_3$ aqueous solution to react with the backside of the semiconductor wafer,
   the $HF/HNO_3$ aqueous solution is a solution of 49% HF aqueous solution mixed with concentrated nitric acid,
   and the ratio by volume of the 49% HF aqueous solution to concentrated nitric acid is in the range of 10:1 to 5000:1 with reference to the volume before mixing; and
   (4) dicing the processed semiconductor wafer obtained from steps (1) to (3).

2. The method of manufacturing a semiconductor chip according to claim 1, wherein a polishing step and/or a wet etching step is performed on the backside of the semiconductor wafer before step (3) after step (2) is finished.

3. A semiconductor chip obtained from the method of manufacturing according to claim 1.

4. A semiconductor device including the semiconductor chip according to claim 3.

5. The method of manufacturing a semiconductor chip according to claim 1, wherein
   the stain etching method further comprises applying light to the backside of the semiconductor wafer.

6. The method of manufacturing a semiconductor chip according to claim 1, wherein
   the ratio by volume of the 49% HF aqueous solution to concentrated nitric acid is in the range of 100:1 to 1000:1 with reference to the volume before mixing.

7. The method of manufacturing a semiconductor chip according to claim 1, wherein
   surfactant is added to the $HF/HNO_3$ aqueous solution.

8. The method of manufacturing a semiconductor chip according to claim 1, wherein
   the porous single crystal layer is comprised of erosion holes extending continuously from the backside of the semiconductor wafer in an inward direction of the semiconductor wafer, oxide films formed on inner surface of the erosion holes, and a single crystal portion by the stain etching method.

9. The method of manufacturing a semiconductor chip according to claim 8, wherein
   the porous single crystal layer has a thickness ranging from 0.02 μm to 5 μm as values from the backside of the semiconductor wafer with reference to the direction normal to the surface of the semiconductor wafer, and
   an amount of the single crystal portion ranges from 25 to 95 percent by volume relative to the total volume of the erosion holes, the oxide films and the single crystal portion in the porous single crystal layer.

10. The method of manufacturing a semiconductor chip according to claim 8, wherein
    the single crystal portion is comprised of silicon containing boron, and a concentration of the boron is $1 \times 10^{15}/cm^3$ or more relative to the silicon.

11. The method of manufacturing a semiconductor chip according to claim 8, wherein
    the single crystal portion is comprised of silicon containing boron, and a concentration of the boron is $1 \times 10^{18}/cm^3$ or more relative to the silicon.

12. The method of manufacturing a semiconductor chip according to claim 1, wherein
    the semiconductor wafer is provided with an epitaxial growth layer containing less than $3 \times 10^{18}/cm^3$ on the main surface of the semiconductor wafer containing $3 \times 10^{18}/cm^3$ to $7 \times 10^{18}/cm^3$ of boron.

13. A method of manufacturing a semiconductor device where the method includes steps (1) to (5) and step (3) includes a stain etching method, comprising:
    (1) forming semiconductor device regions at respective positions on a main surface of a semiconductor wafer;
    (2) grinding a backside of the semiconductor wafer to a predetermined thickness;
    (3) providing a porous single crystal layer on the backside of the semiconductor wafer, wherein
    the stain etching method is performed by causing a $HF/HNO_3$ aqueous solution to react with the backside of the semiconductor wafer,
    the $HF/HNO_3$ aqueous solution is a solution of 49% HF aqueous solution mixed with concentrated nitric acid,
    and the ratio by volume of the 49% HF aqueous solution to concentrated nitric acid is in the range of 10:1 to 5000:1 with reference to the volume before mixing;
    (4) dicing the processed semiconductor wafer obtained from steps (1) to (3); and
    (5) incorporating a semiconductor chip obtained from step (4) into the semiconductor device.

* * * * *